US012170520B2

(12) United States Patent
Hu et al.

(10) Patent No.: US 12,170,520 B2
(45) Date of Patent: Dec. 17, 2024

(54) DRIVING OUTPUT CIRCUIT, CHIP, AND DRIVING OUTPUT METHOD

(71) Applicant: Montage Technology (Kunshan) Co., Ltd., Suzhou (CN)

(72) Inventors: Zongjie Hu, Suzhou (CN); Yufei Gu, Suzhou (CN); Lei Chen, Suzhou (CN)

(73) Assignee: Montage Technology (Kunshan) Co., Ltd., Jiangsu (CN)

( * ) Notice: Subject to any disclaimer, the term of this patent is extended or adjusted under 35 U.S.C. 154(b) by 0 days.

(21) Appl. No.: 17/802,133

(22) PCT Filed: May 25, 2021

(86) PCT No.: PCT/CN2021/095737
§ 371 (c)(1),
(2) Date: Aug. 24, 2022

(87) PCT Pub. No.: WO2022/134454
PCT Pub. Date: Jun. 30, 2022

(65) Prior Publication Data
US 2024/0223162 A1     Jul. 4, 2024

(30) Foreign Application Priority Data

Dec. 24, 2020  (CN) .......................... 202011551720.9

(51) Int. Cl.
H03K 17/687     (2006.01)
H03K 3/012      (2006.01)
(Continued)

(52) U.S. Cl.
CPC ......... *H03K 3/012* (2013.01); *H03K 17/6872* (2013.01); *H03K 19/01* (2013.01);
(Continued)

(58) Field of Classification Search
CPC ...... H03K 3/012; H03K 17/04; H03K 17/041; H03K 17/04106; H03K 17/0412;
(Continued)

(56) References Cited

U.S. PATENT DOCUMENTS 5,153,450 A    10/1992   Ruetz
6,469,565 B1   10/2002   Lee
(Continued)

*Primary Examiner* — Long Nguyen
(74) *Attorney, Agent, or Firm* — IPRTOP LLC

(57) ABSTRACT

A driving output circuit, a chip, and a driving output method are provided; the driving output circuit includes: a timer for outputting a timing signal; a bootstrap module for generating a first turn-on voltage based on an input signal; a charge pump for generating a second turn-on voltage based on the timing signal; a driving module including an upper driving MOSFET and a lower driving MOSFET connected to the upper driving MOSFET, and the upper driving MOSFET is connected to the lower driving MOSFET at a signal output; the first turn-on voltage and the second turn-on voltage are both used to turn on the upper driving MOSFET and/or the lower driving MOSFET to cause the signal output to output an output signal. The present disclosure provides a dynamic hybrid driving output circuit, which has improved gate oxide reliability and an enhanced anti-leakage function when not powered.

17 Claims, 6 Drawing Sheets

(51) Int. Cl.
 *H03K 19/01* (2006.01)
 *H03K 19/0175* (2006.01)
 *H03K 19/20* (2006.01)

(52) U.S. Cl.
 CPC ......... *H03K 19/0175* (2013.01); *H03K 19/20* (2013.01); *H03K 2217/0063* (2013.01); *H03K 2217/0072* (2013.01)

(58) Field of Classification Search
 CPC ......... H03K 17/04123; H03K 17/0416; H03K 17/04163; H03K 17/687; H03K 17/6871; H03K 17/6872; H03K 19/01; H03K 19/017; H03K 19/01707; H03K 19/01714; H03K 19/01721; H03K 19/0175; H03K 19/017509; H03K 19/20; H03K 2217/0063
 See application file for complete search history.

(56) References Cited

U.S. PATENT DOCUMENTS

| | | | |
|---|---|---|---|
| 9,245,596 B1 * | 1/2016 | Yang | G11C 16/12 |
| 10,790,811 B2 * | 9/2020 | Lee | H01L 29/2003 |

* cited by examiner (a)          (b)

DRIVING OUTPUT CIRCUIT, CHIP, AND DRIVING OUTPUT METHOD

CROSS REFERENCE TO RELATED APPLICATION

This is a Sect. 371 National Stage of PCT International Application No. PCT/CN2021/095737, filed on May 27, 2021, which claims the benefit of priority to Chinese Patent Application No. CN 2020115517209, entitled "DRIVING OUTPUT CIRCUIT, CHIP, AND DRIVING OUTPUT METHOD", filed with CNIPA on Dec. 24, 2020, the disclosure of which is incorporated herein by reference in its entirety.

FIELD OF TECHNOLOGY

The present disclosure relates to an integrated circuit and, in particular, to a driving output circuit, a chip, and a driving output method.

BACKGROUND

With the development of electronic systems, chips manufactured by different processes and chips with different supply voltages are often used in the same system, which means the chips need to follow a certain set of communication protocols before they can exchange information between each other. In some cases, the chips need to be compatible with different communication protocols. For example, some chips are designed to be compatible with the Improved Inter Integrated Circuit (I3C) protocol so as to improve the transmission speed of the system, and they also need to be compatible with the Inter Integrated Circuit (I2C) protocol so that they can communicate with chips that are compatible with only the I2C protocol. As a result, new requirements are put forward for the input-output (I/O) design of chips: their I/O supply voltage should be lower than their core supply voltage, their bus should be able to withstand a voltage level several times the I/O supply voltage, and there should be no leakage when the chips are not powered and the bus has electrical signal input. The prior art solves the above problem by using an output circuit with a gate tracking circuit and a floating N-well circuit as shown in FIG. 1. Such circuit design achieves strong I/O output capability and takes into account gate oxide reliability and leakage prevention when the bus voltage (i.e., the external voltage connected to the PAD outside the I/O) is twice the I/O power supply voltage VDD and the power supply is active (i.e., the chip is powered). However, in such a circuit, when there is no power from the power supply (i.e., the chip is not powered) and the output of the corresponding circuit is driven by an electrical signal, it is no longer possible to achieve both gate oxide reliability and leakage prevention. In such a circuit, if each positive channel metal oxide semiconductor transistor (PMOS transistor) has a high threshold, the problems that occur when there is no power from the power supply can be solved; but when VDD is too low, the PMOS transistor in the output stage circuit, i.e., $P_{o1}$, cannot be turned on and cannot work properly.

Therefore, how to provide a driving output circuit, a chip, and a driving output method, to ensure small chip/circuit area and low power consumption, while achieving both gate oxide reliability and leakage prevention, is an urgent technical problem facing those skilled in the art.

SUMMARY

The present disclosure provides a driving output circuit, a chip, and a driving output method.

The driving output circuit is for driving an input signal and generating an output signal. The driving output circuit includes: a timer for outputting a timing signal based on a duration of a high level of the input signal; an bootstrap module for generating a first turn-on voltage based on the input signal; a charge pump, connected to the timer, for generating a second turn-on voltage based on the timing signal; a driving module, connected to the bootstrap module and the charge pump, respectively; the driving module includes a upper driving metal-oxide-semiconductor field-effect transistor (MOSFET) and a lower driving MOSFET connected to the upper driving MOSFET, and where the upper driving MOSFET and the lower driving MOSFET are connected at a signal output; the first turn-on voltage and the second turn-on voltage are both used to make the upper driving MOSFET and/or the lower driving MOSFET be turned on so as to cause the signal output to output an output signal.

In an embodiment of the present disclosure, the upper driving MOSFET includes a first upper driving MOSFET and a second upper driving MOSFET, where the first upper driving MOSFET and the second upper driving MOSFET are connected at the signal output; the first upper driving MOSFET is connected to the bootstrap module, receives the first turn-on voltage provided by the bootstrap module, and is turned on after receiving the first turn-on voltage, so as to cause the signal output to output a high level signal; the second upper driving MOSFET is connected to the charge pump, receives the second turn-on voltage provided by the charge pump, and is turned on after receiving the second turn-on voltage, so as to cause the signal output to output a high level signal.

In an embodiment of the present disclosure, the driving module further includes a first pre-driving unit, and the first pre-driving unit is connected to the first upper driving MOSFET for driving the first turn-on voltage and transmitting the first turn-on voltage to the first upper driving MOSFET.

In an embodiment of the present disclosure, the first pre-driving unit includes a first PMOS transistor and a first NMOS transistor; a gate of the first PMOS transistor is connected to a gate of the first NMOS transistor, and a drain of the first PMOS transistor is connected to a drain of the first NMOS transistor; when turned on, the first PMOS transistor transmits the first turn-on voltage to the first upper driving MOSFET; when turned on, the first NMOS transistor makes the first upper driving MOSFET be turned off.

In an embodiment of the present disclosure, the driving module further includes a second pre-driving unit, the second pre-driving unit is connected to the second upper driving MOSFET for driving the second turn-on voltage and transmitting the second turn-on voltage to the second upper driving MOSFET.

In an embodiment of the present disclosure, the timing signal includes a first signal and a second signal; the second pre-driving unit includes a second PMOS transistor and a second NMOS transistor; the second PMOS transistor has a gate connected to a gate of the second NMOS transistor, and the second PMOS transistor has a drain connected to a drain of the second NMOS transistor; the second PMOS transistor is configured to be turned on based on the second signal, and, when turned on, transmit the second turn-on voltage to the second upper driving MOSFET; the second NMOS transistor is configured to be turned on based on the first signal, and, when turned on, make the second upper driving MOSFET be turned off.

In an embodiment of the present disclosure, the bootstrap module includes a control MOSFET and a bootstrap capacitor; the control MOSFET is connected to the bootstrap capacitor, and the control MOSFET and the bootstrap capacitor are connected at a connection point which serves as a bootstrap voltage output terminal; when turned on, the control MOSFET charges the bootstrap capacitor; when the control MOSFET is turned off, a voltage at the bootstrap voltage output is lifted through the bootstrap capacitor.

In an embodiment of the present disclosure, the bootstrap module further includes a buffer; the buffer is connected to the bootstrap capacitor for driving the bootstrap module for voltage boosting.

In an embodiment of the present disclosure, the bootstrap module further includes a AND gate, where a first input of the AND gate is for receiving the input signal, and a second input of the AND gate is for receiving a conversion signal of the timing signal to cause an output of the AND gate to output a gate voltage of the control MOSFET based on the input signal and the conversion signal.

In an embodiment of the present disclosure, the driving output circuit further includes: a NAND gate, where a first input of the NAND gate is for receiving the timing signal and a second input of the NAND gate is for receiving the input signal, an output of the NAND gate is for outputting a judgment signal based on the timing signal and the input signal, and transmitting the judgment signal to the second input of the AND gate.

In an embodiment of the present disclosure, the driving output circuit further includes: a third pre-driving unit, connected to the driving module, the bootstrap module, and the timer, respectively, where the third pre-driving unit enhances driving capability of the input signal.

In an embodiment of the present disclosure, the driving output circuit further includes: a level shifting circuit, connected to the timer and the charge pump, where the level shifting circuit is for performing level conversion on the timing signal to output a signal with a level matching the charge pump.

In an embodiment of the present disclosure, the timer is a voltage comparator, and the voltage comparator is used to toggle operating states of the bootstrap module and the charge pump according to changes in magnitudes of the first turn-on voltage.

In an embodiment of the present disclosure, the lower driving MOSFET includes a first lower driving MOSFET and a second lower driving MOSFET, and the first lower driving MOSFET and the second lower driving MOSFET are connected at the signal output; the first lower driving MOSFET is connected to the bootstrap module, receives the first turn-on voltage provided by the bootstrap module, and is turned on after receiving the first turn-on voltage, so as to cause the signal output to output a low level signal; the second lower driving MOSFET is connected to the charge pump, receives the second turn-on voltage provided by the charge pump, and is turned on after receiving the second turn-on voltage, so as to cause the signal output to output a low level signal.

The present disclosure also provides a chip including: the driving output circuit.

In an embodiment of the present disclosure, the chip is a communication interface chip, and the communication interface chip is used for driving output for at least two input signals.

The present disclosure further provides a driving output method, applied to the driving output circuit; the driving output method includes: outputting a timing signal based on a duration of a high level of an input signal; providing a first turn-on voltage to a driving module based on the input signal, where the first turn-on voltage is generated by a bootstrap module; and providing a second turn-on voltage to the driving module based on the timing signal, where the second turn-on voltage is generated by a charge pump.

REFERENCE NUMERALS

1 Driving output circuit
11 Driving module
12 Bootstrap module
13 Timer
14 Charge pump
S11~S13 Various steps

DETAILED DESCRIPTION

The following describes the implementation of the present disclosure through specific examples, and those skilled in the art can easily understand other advantages and effects of the present disclosure from the content disclosed in this specification. The present disclosure can also be implemented or applied through other different specific embodiments. Various details in this specification can also be modified or changed based on different viewpoints and applications without departing from the spirit of the present disclosure. It should be noted that the following embodiments and the features in the embodiments can be combined with each other if no conflict will result.

It should be noted that the drawings provided in this disclosure only illustrate the basic concept of the present disclosure in a schematic way, so the drawings only show the components related to the present disclosure. The drawings are not necessarily drawn according to the number, shape and size of the components in actual implementation; during the actual implementation, the type, quantity and proportion of each component can be changed as needed, and the components' layout can also be more complicated.

The present disclosure provides a dynamic hybrid driving output circuit. When transmitting signals, the circuit of the present disclosure is able to generate high voltage through a bootstrap module to quickly complete high level transmission, and is able to maintain a strong pull-up capability by using a charge pump to output high voltage; at the same time, the charge pump only handles low-speed signals, and therefore less driving capability is required for the charge pump, thereby significantly reducing the corresponding I/O circuit area and power consumption. In addition, the circuit of the present disclosure improves the reliability of I/O gate oxide and prevents the occurrence of current leakage in the event of a loss of power, by utilizing the upper and lower NMOS transistors for output.

The principle and implementation of the driving output circuit, chip and driving output method will be described in detail below in conjunction with FIGS. 2 to 11.

Figure 1:
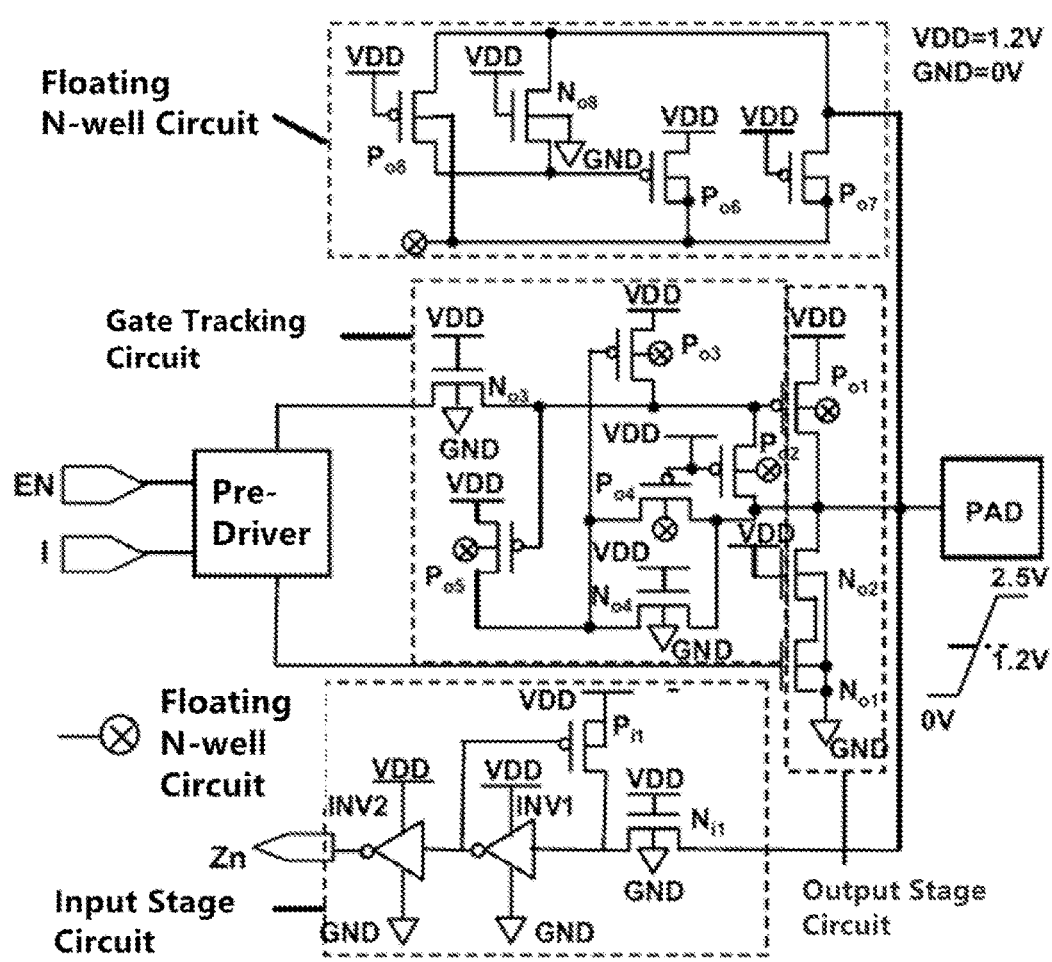
FIG. 1 shows a diagram of a hybrid voltage output circuit in the prior art.
Figure 2:
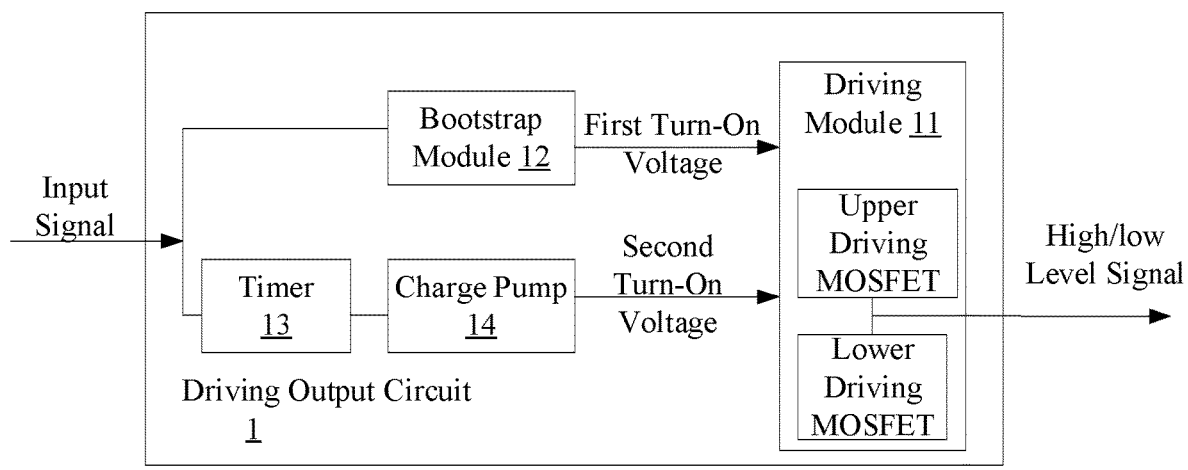
FIG. 2 shows a schematic diagram of a driving output circuit according to one embodiment of the present disclosure.

FIG. 2 shows a schematic diagram of a driving output circuit according to one embodiment of the present disclosure. As shown in FIG. 2, the driving output circuit 1 includes a driving module 11, a bootstrap module 12, a timer 13, and a charge pump 14 and is used to drive an input signal and generate an output signal.

The timer 13 is used to output a timing signal based on a duration of a high level of the input signal.

The bootstrap module 12 is used to generate a first turn-on voltage based on the input signal.

The charge pump 14 is connected to the timer 13, for generating a second turn-on voltage based on the timing signal.

The driving module 11 is connected to the bootstrap module 12, and the charge pump 14, respectively.

The driving module includes a upper driving metal-oxide-semiconductor field-effect transistor (MOSFET) and a lower driving MOSFET connected to the upper driving MOSFET, where the connection point between the upper driving MOSFET and the lower driving MOSFET serves as a signal output terminal; the first turn-on voltage and the second turn-on voltage are both used to make the upper driving MOSFET and/or the lower driving MOSFET be turned on so as to further cause the signal output to output an output signal.

Figure 3:
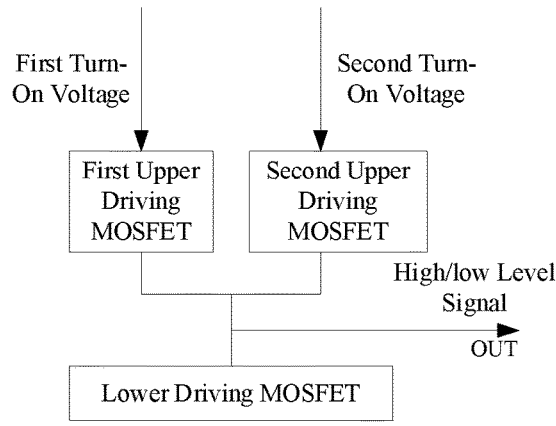
FIG. 3 shows a schematic diagram illustrating turn-on voltage control of a driving output circuit according to one embodiment of the present disclosure.

FIG. 3 shows a schematic diagram illustrating turn-on voltage control of a driving output circuit according to one embodiment of the present disclosure. As shown in FIG. 3, in one embodiment, the upper driving MOSFET includes a first upper driving MOSFET and a second upper driving MOSFET, where the first upper driving MOSFET and the second upper driving MOSFET are connected at the signal output.

The first upper driving MOSFET is connected to the bootstrap module 12, receives the first turn-on voltage provided by the bootstrap module 12, and is turned on after receiving the first turn-on voltage, so as to cause the signal output OUT to output a high level signal.

The second upper driving MOSFET is connected to the charge pump 14, receives the second turn-on voltage provided by the charge pump 14, and is turned on after receiving the second turn-on voltage, so as to cause the signal output OUT to output a high level signal.

Figure 4A:
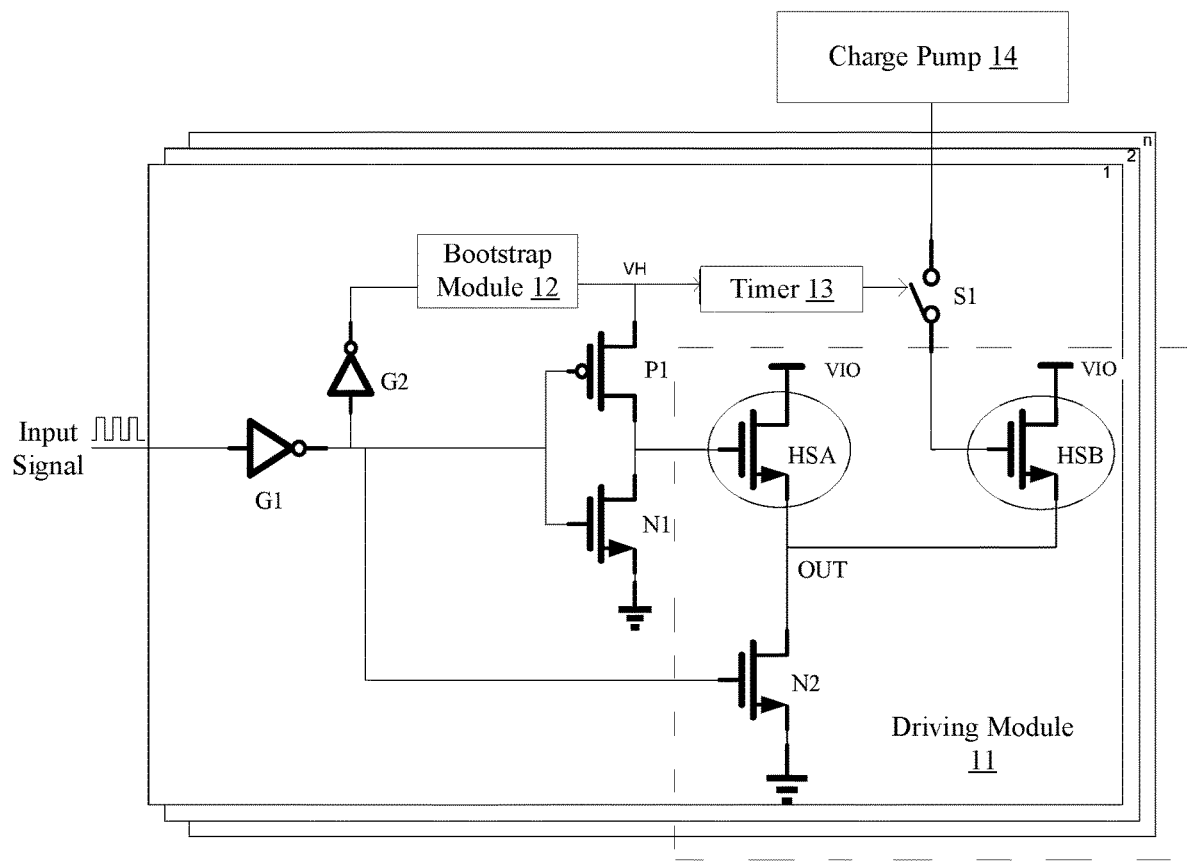
FIG. 4A shows a circuit diagram of a driving output circuit according to one embodiment of the present disclosure.

FIG. 4A shows a circuit diagram of a driving output circuit according to one embodiment of the present disclosure. As shown in FIG. 4A, the input signal is fed into the driving circuit and passes through a first NOT gate G1. Then, the resulted signal is transmitted via three paths: in the first path, it is transmitted to a second NOT gate G2, which in turn feeds the signal to the bootstrap module 12, which outputs a bootstrap voltage, i.e., a first turn-on voltage VH, according to the input signal, and the bootstrap module 12 is connected to the timer 13 and a pre-driving circuit; in the second path, it is transmitted to the pre-driving circuit, where the pre-driving circuit is connected to the first upper driving MOSFET HSA; specifically, the pre-driving circuit includes a PMOS transistor P1 and an NMOS transistor N1; gates of P1 and N1 are connected together and both are connected to an output of the first NOT gate G1, a drain of P1 is connected to a drain of N1, and both are connected to a gate of the first upper driving MOSFET HSA, a source of P1 is connected to an output of the bootstrap module 12. When P1 is turned on, the first turn-on voltage VH is input to the gate of the first upper driving MOSFET HSA, causing HSA to turn on, and a chip power supply VIO is output from a source of HSA as a high level signal; when N1 is turned on, a gate voltage of HSA is pulled down, and then HSA is turned off. The first turn-on voltage VH is also input to the timer 13, which is connected to a control terminal of a switch S1, and the charge pump 14 is connected to a gate of the second upper driving MOSFET HSB via the switch S1; the switch S1 is closed when the output of the timer 13 is 1, and is opened when the output of the timer 13 is 0; When the timing signal output from the timer 13 is 1, the switch S1 is closed and the charge pump 14 outputs the second turn-on voltage to turn on HSB, and the chip power supply VIO is output as a high level signal from a source of HSB; in the third path, it is transmitted to drive the lower driving MOSFET N2.

The first upper driving MOSFET HSA is an NMOS transistor coupled to the bootstrap module, generating a strong transient impedance; the second upper driving MOSFET HSB is an NMOS transistor connected to the charge pump 14 via a switch, generating a strong steady-state impedance.

Referring to FIG. 4A, operations of the driving output circuit is described schematically with the input signal being a signal consisting of 0 and 1 as an example.

(1) When the input signal is 1 and the timer 13 outputs 0, the first NOT gate G1 outputs 0 so that P1 is turned on, and the first turn-on voltage VH is input to the gate of the HSA through P1 so that HSA is turned on, and VIO is output as a high level signal from the source of HSA, i.e., I/O outputs a high level signal.

(2) When the input signal is 1 and the timer 13 outputs 1, the switch S1 is closed, the HSA is weakly turned on, the charge pump 14 outputs the second turn-on voltage so that HSB is turned on, and VIO is output as a high level signal from the source of HSB, i.e., I/O outputs a high level signal.

(3) When the input signal is 0, the first NOT gate outputs 1, so that P1 is turned off and N1 is turned on, and then the gate voltage of HSA is pulled down and HSA is turned off. At this time, if the timer 13 does not detect a high level signal, its output signal is 0 and the switch S1 is opened, whereby the HSB is turned off, and the output of the first NOT gate also makes the lower driving MOSFET N2 be turned on, and a drain of the N2 outputs a low level signal, i.e. I/O outputs a low level signal.

Figure 4B:
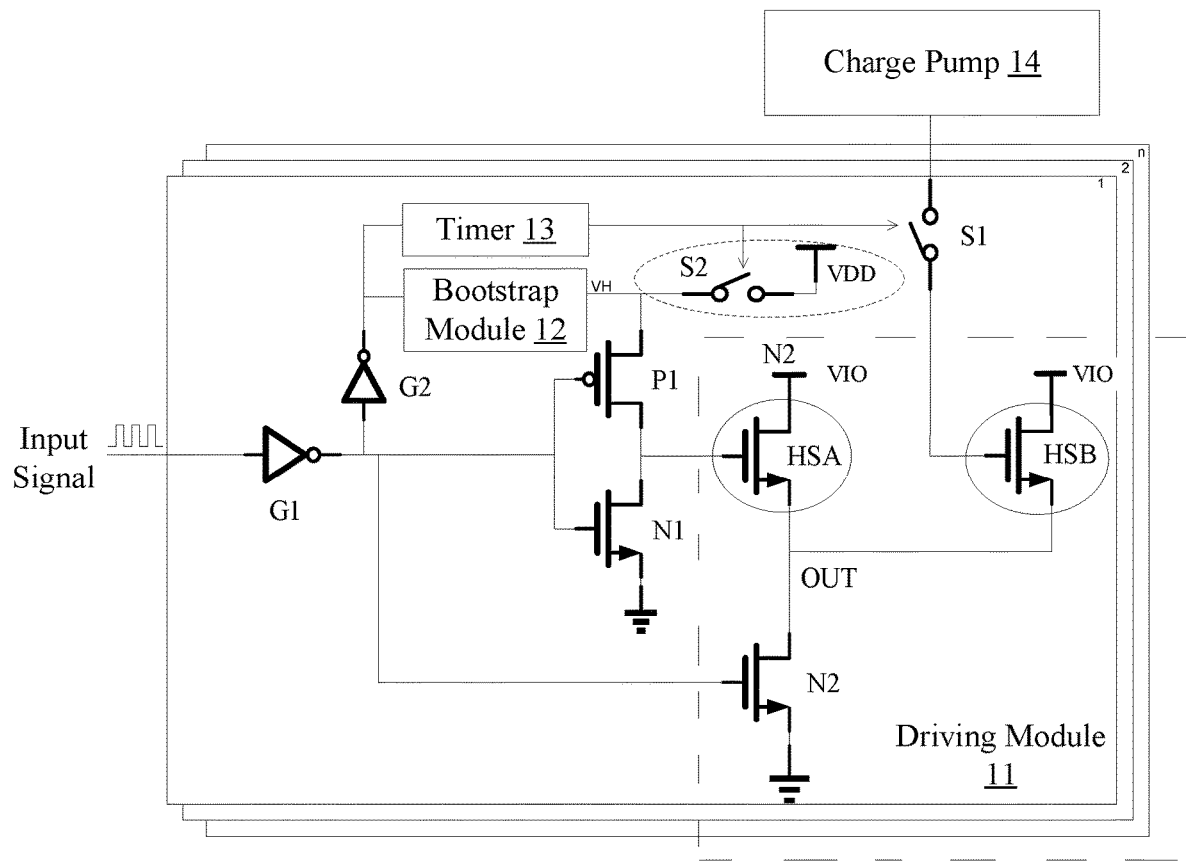
FIG. 4B shows a circuit diagram of a driving output circuit according to one embodiment of the present disclosure.

FIG. 4B shows a circuit diagram of a driving output circuit according to another embodiment of the present disclosure. The difference between the circuits of FIG. 4A and FIG. 4B of the present disclosure is that in FIG. 4B, G2 is connected to the timer 12 and the bootstrap module 12, respectively, the bootstrap module 12 is connected to a power supply VDD via the switch S2, the timer 13 is connected to control terminals of the switch S2 and switch S1, respectively. Also, control logics of the circuits of FIG. 4A and FIG. 4B are different: in the embodiment of FIG. 4A, a control signal of switch S1 is generated based on an output of the bootstrap module 12 and an output of the timer 13 after logic conversion; in the embodiment of FIG. 4B, the control signal of the switch S1 is generated based only on the output of the timer 13, and the output of the timer 13 is also used to control the switch S2.

As shown in FIG. 4B, the input signal is fed into the driving circuit and passes through the first NOT gate G1. Then, the resulted signal is transmitted via three paths: in the first path, it is transmitted to the second NOT gate, which in turn transmits the signal to the bootstrap module 12 and the timer 13, respectively, and the bootstrap module 12 outputs a bootstrap voltage, i.e., the first turn-on voltage VH so that HSA is turned on; in the second path, it is directly input to the pre-driving circuit composed of a PMOS transistor and an NMOS transistor, and the pre-driving circuit drives and inputs the first turn-on voltage VH to the gate of the first upper driving MOSFET HSA so that HSA is turned on, and VIO is output from the source of HSA as a high level signal, i.e., I/O outputs a high level signal; when the timing signal output from the timer 13 is 1, the switch S2 is closed so that the output of the bootstrap module is connected to the power supply VDD, and VDD is used as the turn-on voltage for HSA which is weakly turned on; the switch S1 is also closed, the charge pump 14 outputs the second turn-on voltage so that HSB is turned on, and VIO is output from the source of HSB as a high level signal, i.e., I/O outputs a high level signal; in the third path, it is output to drive the lower driving MOSFET N2.

Figure 5:
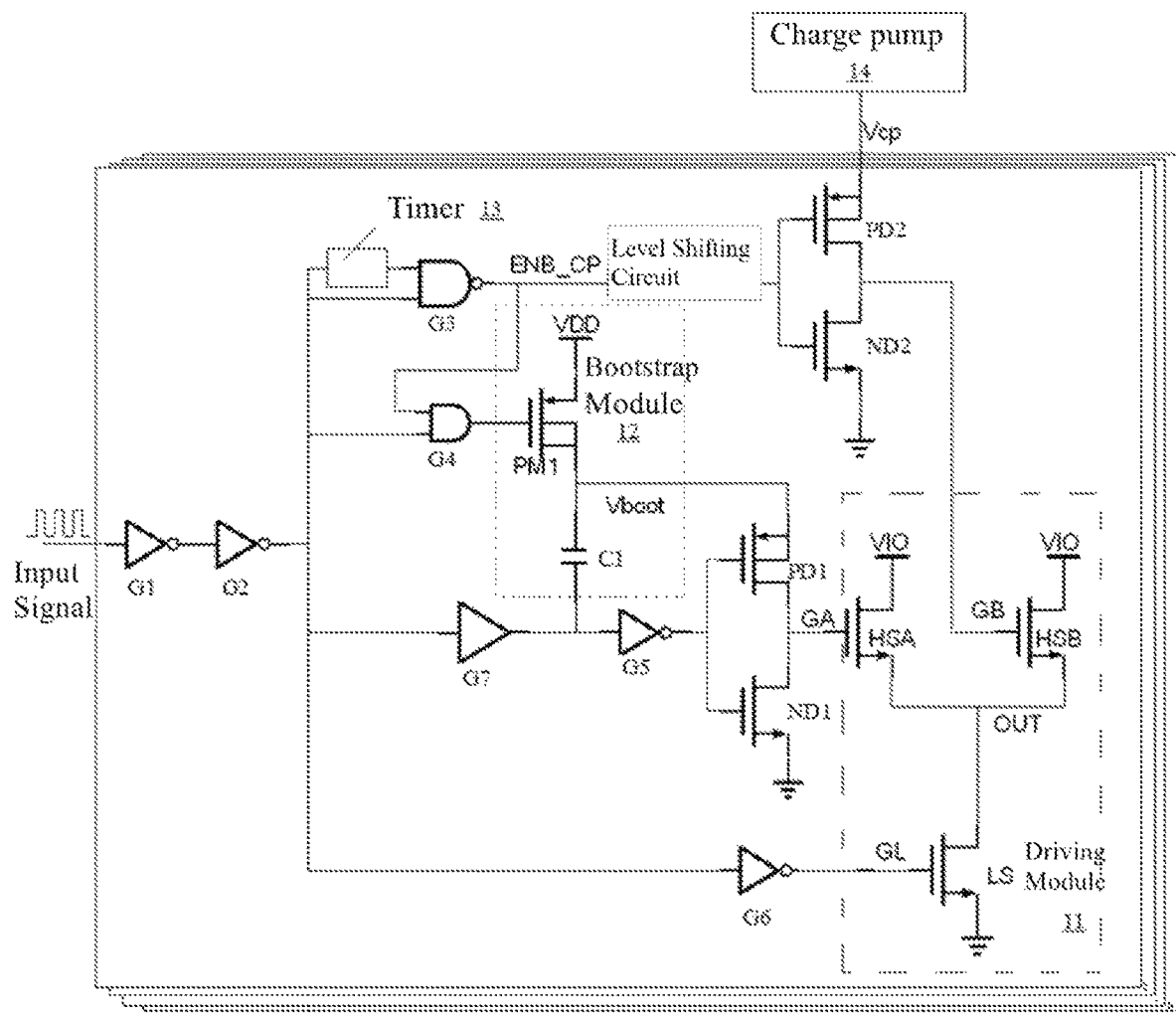
FIG. 5 shows a circuit diagram illustrating hybrid driving of a driving output circuit according to one embodiment of the present disclosure.

FIG. 5 shows a circuit diagram illustrating hybrid driving of a driving output circuit according to one embodiment of the present disclosure. FIG. 5 shows the specific circuitry of a driving output circuit in an embodiment corresponding to FIG. 4B. In the embodiment of FIG. 5, when the timing signal is a first signal, the timing signal is 0, and when the timing signal is a second signal, the timing signal is 1.

The driving module further includes a first pre-driving unit, and the first pre-driving unit is connected to the first upper driving MOSFET HSA for driving the first turn-on voltage and outputting it to the gate GA of the first upper driving MOSFET HSA.

Specifically, the first pre-driving unit includes a first PMOS transistor PD1 and a first NMOS transistor ND1.

A gate of the first PMOS transistor PD1 and a gate of the first NMOS transistor ND1 are connected and connected to an output of a third NOT gate G5, and a drain of the first PMOS transistor PD1 and a drain of the first NMOS transistor ND1 are connected and connected to the gate GA of the first upper driving MOSFET HSA.

When turned on, the first PMOS transistor PD1 is used to transmit the first turn-on voltage from the output of the bootstrap module 12 to the first upper driving MOSFET HSA.

When the first NMOS transistor ND1 is turned on, it makes the first upper driving MOSFET HSA be turned off.

The driving module includes a second pre-driving unit, and the second pre-driving unit is connected to the second upper driving MOSFET HSB for driving the second turn-on voltage Vcp and outputting it to the gate GB of the second upper driving MOSFET HSB.

Specifically, the second pre-driving unit includes a second PMOS transistor PD2 and a second NMOS transistor ND2.

A gate of the second PMOS transistor PD2 is connected to a gate of the second NMOS transistor ND2, and a drain of the second PMOS transistor PD2 is connected to a drain of the second NMOS transistor ND2 and connected to the gate GB of the second upper driving MOSFET HSB.

The second PMOS transistor PD2 is turned on when the second signal is output by the timer, and when turned on, transmits the second turn-on voltage Vcp to the gate of the second upper driving MOSFET HSB, causing the second upper driving MOSFET HSB to be turned on.

The second NMOS transistor ND2 is turned on when the first signal is output by the timer, and when the second NMOS transistor ND2 is turned on, it makes the second upper driving MOSFET HSB be turned off.

The bootstrap module 12 includes a control MOSFET PM1 and a bootstrap capacitor C1.

A drain of the control MOSFET PM1 is connected to the bootstrap capacitor C1, and the control MOSFET and the bootstrap capacitor are connected at a connection point which serves as a bootstrap voltage output terminal.

When turned on, the control MOSFET PM1 charges the bootstrap capacitor C1; when turned off, the control MOSFET PM1 lifts the voltage at the output of the bootstrap voltage through the bootstrap capacitor C1.

The bootstrap module includes a buffer G7; an output of the buffer G7 is connected to the bootstrap capacitor C1 for driving the bootstrap module for voltage boosting.

The driving output circuit includes: a NAND gate G3, which has a first input for receiving the timing signal and a second input for receiving the input signal or an input signal driven by a NOT gate; the NAND gate G3 outputs a judgment signal ENB_CP based on the timing signal and the input signal, and transmits the judgment signal ENB_CP into a second input of an AND gate G4.

The driving output circuit includes the AND gate G4; a first input of the AND gate G4 is used to receive the input signal or an input signal driven by a NOT gate. The AND gate G4 outputs a voltage applied to the gate of the control MOS PM1 according to the input signal and the judgment signal ENB_CP.

The driving output circuit includes: a third pre-driving unit (including G1 and G2) for pre-driving the input signal.

It is to be noted that a logic gate or logic gate unit involved in the present disclosure may be a single logic gate or a combination of logic gates connected in series or parallel that have an equivalent logic function, such as AND, NOT, OR, NOR, and NAND.

The driving output circuit further includes: a level shifting circuit, connected between the NAND gate G3 and the second pre-driving unit, for performing level conversion on the judgment signal ENB_CP outputted by the NAND gate G3, whose inputs include the timing signal, to output a signal with a level matching the charge pump.

In one embodiment, the timer is a conventional timer; in another embodiment, the timer is a voltage comparator, and the voltage comparator is used to toggle operating states of the bootstrap module and the charge pump according to changes in magnitudes of the first turn-on voltage.

It is to be noted that the timer described in the present disclosure implements a timing function as defined in a general sense, which can be a direct recording of the duration of the high level signal. In some other embodiments, the timing function can be implemented indirectly by first detecting/measuring the value of any identifying electrical signal and then comparing the detected value with a corresponding pre-determined value, the result of which should vary with time, i.e. the result has a time attribute. For example, the voltage at the output node Vboot of the bootstrap module in FIG. 5 is used as an identifiable electrical signal; the voltage at the Vboot node is first detected, and when the voltage at Vboot is below a pre-determined threshold, the voltage output from the charge pump 14 is input to the gate of HSB.

Referring to FIG. 5, operations of the driving output circuit is described schematically with the input signal being a signal consisting of 0 or 1 as an example:

(1) When the input signal changes from 1 to 0, the output of NOT gate G1 becomes 1, the output of NOT gate G2 becomes 0, and an output of a fourth NOT gate G6 becomes 1. As a result, the voltage at a gate GL of NMOS transistor LS is pulled up, NMOS transistor LS is turned on, and the signal output OUT outputs a low level signal, i.e., the I/O outputs a low level signal. Since the second NOT gate G2 outputs 0, the timer 13 is timing the high level, and since no high level is detected, its output is 0; in turn, the judgment signal ENB_CP output by the NAND gate G3 is 1, the output of the AND gate G4 is 0, the voltage of PM1 gate is pulled down, PM1 is turned on, and the bootstrap voltage is restored to VDD, ready for the next bootstrapping. At the same time, the output of the second NOT gate G2 passes through the buffer G7 and the third NOT gate G5 in sequence and is finally output as 1. As a result, ND1 is turned on, the voltage at the gate of the first upper driving MOSFET HSA is pulled down and HSA is turned off; moreover, when the judgment signal ENB_CP is 1, ND2 is turned on, the voltage applied to the gate of the second upper driving MOSFET HSB is pulled down and HSB is turned off. That is, HSB and HSA are both turned off, and the voltage at OUT is effectively pulled down, i.e., the I/O outputs a low level signal.

(2) When the input signal changes from 0 to 1, there are two cases:

(2.1) The input signal is a high frequency signal and its high level lasts for a duration shorter than a predetermined value of that of the timer 13, i.e. timer 13 always outputs the first signal 0, and does not output the second signal 1. At this time, the driving output is realized only through bootstrap module 12. When the input signal changes from 0 to 1, the input signal is output as 0 after passing through G1, G2, and G6 in sequence, the voltage applied to the gate GL of NMOS transistor is pulled down, and NMOS transistor LS is turned off; then, the input signal is output as 1 after passing through G1 and G2 in sequence, then enters the timer 13, one output of G3, and one output of G4 respectively, and the timing signal output by the timer 13 is 0; as a result, the G3 outputs ENB_CP as 1 and G4 outputs 1; then, the gate voltage of PM1 is pulled up, PM1 is turned off, and the voltage at the Vboot node is bootstrapped to nearly twice of VDD; meanwhile, the output of G2 goes through buffers G7 and G5 in sequence and is output as 0, and as a result, PD1 is turned on, the bootstrapped voltage is transferred to the gate of the first upper driving MOSFET HAS, and HSA is turned on. The voltage at the signal output OUT is pulled up rapidly to complete the high level transmission, i.e. the I/O outputs a high level signal. Since $V_{DG}$ (voltage difference between drain and gate) of PM1 is higher than its threshold voltage, node Vboot will start discharging to VDD, and as node Vboot discharges, the voltage difference $V_{DG}$ between the drain and gate of PM1 becomes smaller and the discharge rate gradually becomes lower. The discharge causes the voltage at node Vboot to gradually decrease, and the gate voltage of HSA then decreases, and the impedance of HSA gradually increases, but at this time the signal transmission has been completed and no longer requires a strong pull-up capability, and therefore this increased impedance does not affect the transmission. It can be seen that the bootstrap module can make HSA obtain a small transient impedance in a short time.

(2.2) The input signal is a low frequency signal whose high level lasts for a duration that exceeds the predetermined value of that of the timer 13, i.e., the timer 13 outputs the second signal when the duration of high level reaches the predetermined value, at which time, both the bootstrap module 12 and the charge pump 14 are needed for hybrid driving output. Before the timer 13 output 1, the status of the circuit is the same as that of (2.1), to complete the signal transmission process. When the timer 13 reaches the predetermined value and outputs 1, the judgment signal ENB_CP is set to 0, G4 outputs 0, the gate voltage of PM1 is pulled down, PM1 is turned on, and the voltage at the node Vboot is restored to VDD. Meanwhile, G2 outputs 1, which is then output as 0 after passing through buffer G7 and third NOT gate G5 in sequence; as a result, PD1 is still turned on and the voltage at the gate of HSA is maintained at VDD, providing a relatively weaker pull-up capability; the judgment signal ENB_CP is transmitted to the gate of PD2 through the level shifting circuit to turn PD2 on, thus transmitting the output Vcp of the charge pump to the gate of HSB to turn HSB on, to achieve a strong pull-up capability.

Figure 6:
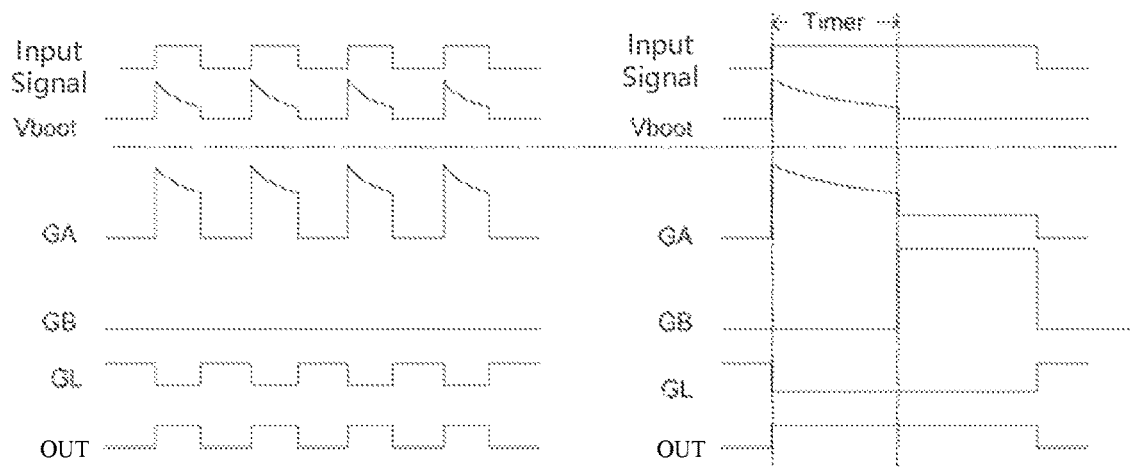
FIG. 6 shows timing waveforms of a driving output circuit according to one embodiment of the present disclosure.

FIG. 6 shows timing waveforms of a driving output circuit according to one embodiment of the present disclosure. As shown in FIG. 6, FIG. 6(*a*) presents the timing variation presented when the input signal is a high-frequency signal passing through the driving output circuit of the present disclosure, and FIG. 6(*b*) presents the timing variation presented when the input signal is a low-frequency signal passing through the driving output circuit of the present disclosure.

As shown in FIG. 6(*a*), when the input signal changes from 0 to 1, the voltage at the node Vboot is instantaneously bootstrapped to a higher voltage, and since the $V_{DG}$ (voltage difference between drain and gate) of PM1 is higher than its threshold voltage, node Vboot will start discharging to VDD, and this discharge causes the voltage at the node Vboot to gradually decrease, and the gate voltage of HSA then decreases, and the impedance of HSA gradually increases, but at this time the signal transmission has been completed and no longer requires a strong pull-up capability, so this increased impedance of HSA does not affect the transmission.

As shown in FIG. 6(*b*), when the input signal changes from 0 to 1, the timer 13 performs driving output through the bootstrap module when the duration of high level does not reach the predetermined value, and after the duration of high level exceeds the predetermined value, the timer 13 outputs 1, thus switching the driving output of the bootstrap module to the voltage VDD, and thus the gate voltage of the HSA maintains a relatively weaker pull-up capability, and the output voltage Vcp of the charge pump 14 is transmitted to the gate of HSB, and thus the gate voltage of HSB has a strong pull-up capability, so that the signal output OUT continues to output high level, i.e. the I/O outputs a high level signal.

In other embodiments, the input signal can also be other signals that are digital, high frequency, or low frequency.

Figure 7:
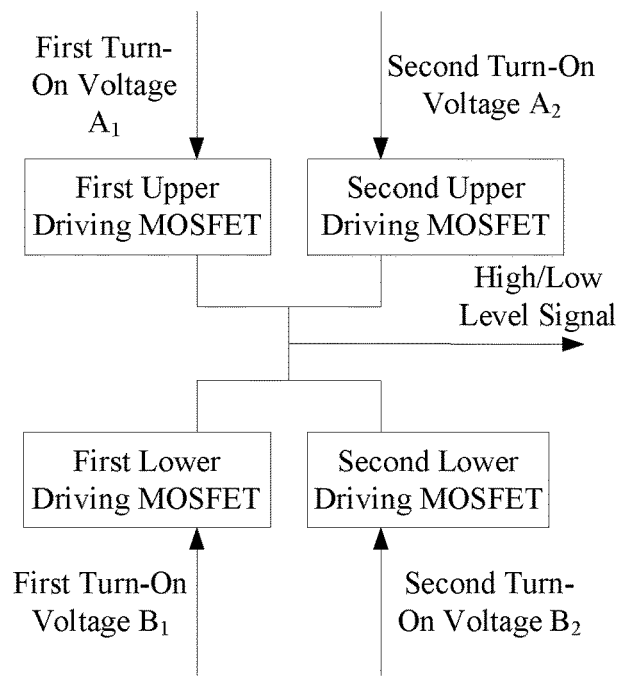
FIG. 7 shows a schematic diagram illustrating turn-on voltage control of a driving output circuit according to one embodiment of the present disclosure.

FIG. 7 shows a schematic diagram illustrating turn-on voltage control of a driving output circuit according to another embodiment of the present disclosure. As shown in FIG. 7, the lower driving MOSFET includes a first lower driving MOSFET and a second lower driving MOSFET, and the connection point of the first lower driving MOSFET and the second lower driving MOSFET is the signal output. Such arrangement makes it possible to control the upper NMOS transistors in the same way the lower NMOS transistors are controlled, achieving the same driving capability for the upper and lower NMOS transistors while reducing the area occupied by the lower NMOS transistors; specifically, the lower NMOS transistors obtain a smaller transient impedance through the bootstrap module, avoiding the dilemma in the prior art: a small circuit area or a small impedance.

As shown in FIG. 7, the upper driving MOSFET includes a first upper driving MOSFET and a second upper driving MOSFET, and the connection point of the first upper driving MOSFET and the second upper driving MOSFET is the signal output.

The first upper driving MOSFET is connected to the bootstrap module for receiving a first turn-on voltage A1 provided by the bootstrap module and then turned on, to cause the signal output to output a high level signal.

The second upper driving MOSFET is connected to the charge pump for receiving a second turn-on voltage $A_2$ provided by the charge pump and then turned on, to cause the signal output to output a high level signal.

The first lower driving MOSFET is connected to the bootstrap module or another bootstrap module for receiving a first turn-on voltage $B_1$ provided by the bootstrap module and then turned on, to cause the signal output to output a low level signal.

The second lower driving MOSFET is connected to the charge pump or another charge pump for receiving a second turn-on voltage $B_2$ provided by the charge pump and then turned on, to cause the signal output to output a low level signal.

Figure 8:
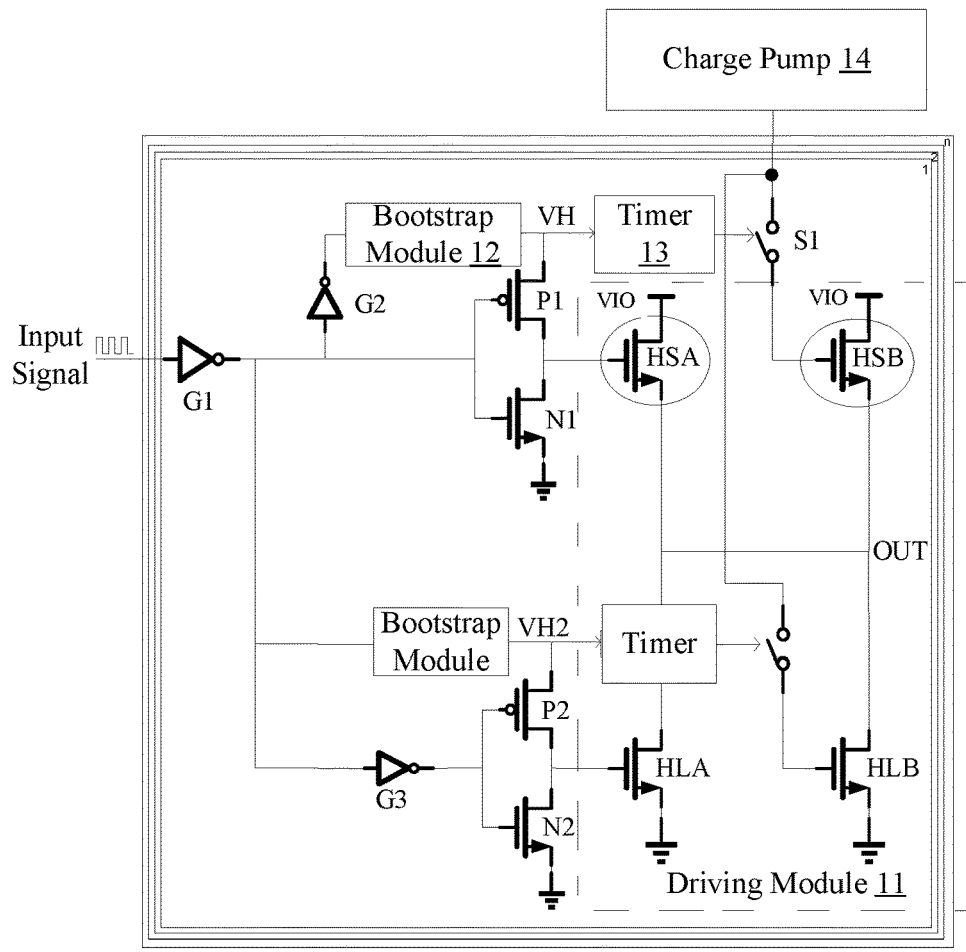
FIG. 8 shows a circuit diagram of a driving output circuit according to one embodiment of the present disclosure.

FIG. 8 shows a circuit diagram of a driving output circuit according to one embodiment of the present disclosure. A circuit corresponding to the principle shown in FIG. 7 is presented in FIG. 8. Assuming the input signal is, for example, a low frequency signal, a specific working principle of the circuit is illustrated: for the upper driving MOSFET, before the timer 13 outputs 1, HSA is turned on by the bootstrap voltage VH, and thus the signal output OUT outputs a high level signal, and after the timer 13 outputs 1, HSB is turned on by the voltage output by the charge pump, and thus outputs a high level signal; for the lower driving MOSFET, before the timer 13 outputs 1, the first lower driving MOSFET HLA is turned on by the bootstrap voltage VH2, and then the signal output OUT outputs a low level signal, and after the timer 13 outputs 1, the second lower driving MOSFET HLB is turned on by the voltage output by the charge pump 14, and then the signal output OUT outputs a low level signal.

Figure 9:
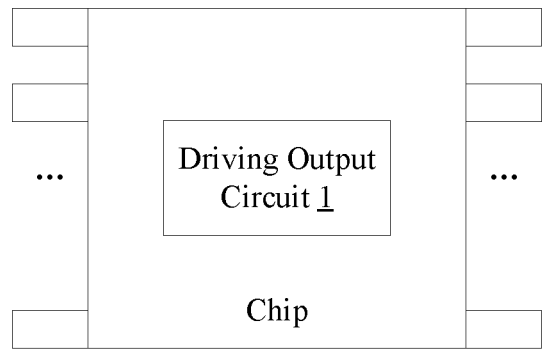
FIG. 9 shows the structure of a chip according to one embodiment of the present disclosure.

FIG. 9 shows the structure of a chip according to one embodiment of the present disclosure. As shown in FIG. 9, the chip described in the present disclosure includes: the driving output circuit as described in FIGS. 2 to 10.

Figure 10:
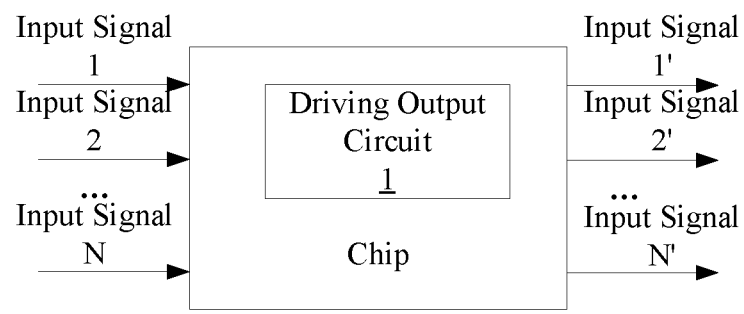
FIG. 10 shows how a chip communicates with external devices according to one embodiment of the present disclosure.

FIG. 10 shows how the chip communicates with external devices according to one embodiment of the present disclosure. As shown in FIG. 10, the chip is a communication interface chip, and the communication interface chip is used for driving output for at least two input signals. As in FIG. 10, input signal 1, input signal 2, . . . , and input signal n are used as multiple I/O for high-speed communication, and after passing through the driving output circuit of the present disclosure, the signals finally output are: input signal 1', input signal 2', . . . , and input signal n'.

In practical applications, in order to improve the communication speed of the system, the Improved Inter Integrated Circuit (I3C) protocol is adopted, and the chip also needs to be compatible with the Inter Integrated Circuit (I2C) protocol.

In the I3C protocol, for multiple I/O transmission of high-speed signals, in order for the charge pump to have a larger driving capacity, a large chip area needs to be occupied by the charge pump, resulting in a high power consumption. In addition, bootstrap drive technology adopting NMOS transistors is often used for a chip's internal sampling clock to achieve high-speed sampling, but the sampling MOSFET thereof can have a low impedance only for a short period of time, which is why the technology is seldom directly applied to I/O circuits.

The present disclosure provides a dynamic hybrid driving utilizing a bootstrap module and a charge pump applied in a high-speed multiplexed I/O communication interface. By adopting dynamic hybrid driving to drive high-voltage NMOS transistors for pull-up, gate oxide reliability and an anti-leakage function when not powered can both be achieved in high-speed multi-channel I/O communication, while the circuit (or chip made of circuits) has a smaller area and a lower power consumption.

Figure 11:
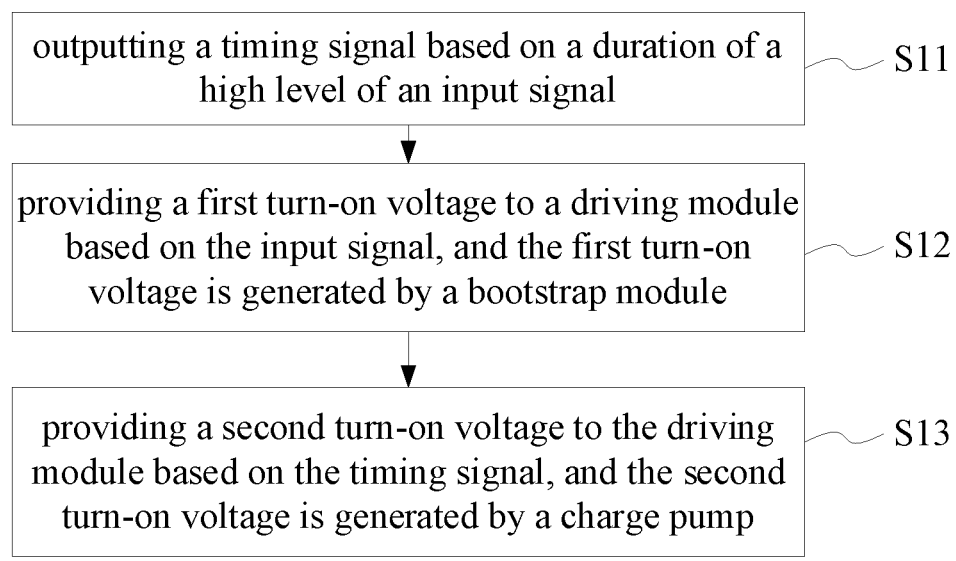
FIG. 11 shows a flowchart illustrating various steps of a driving output method according to one embodiment of the present disclosure.

Please refer to FIG. 11, which shows a flowchart illustrating various steps of a driving output method according to one embodiment of the present disclosure. The driving output method is applied to the driving output circuit as described in FIG. 2 to FIG. 10. As shown in FIG. 11, the driving output method includes the following steps:

S11, outputting a timing signal based on a duration of a high level of an input signal.

S12, providing a first turn-on voltage to a driving module based on the input signal, where the first turn-on voltage is generated by a bootstrap module.

S13, providing a second turn-on voltage to the driving module based on the timing signal, where the second turn-on voltage is generated by a charge pump.

The scope of protection of the driving output method described in the present disclosure is not limited by the order of execution of the steps mentioned in the present disclosure, and all the steps implemented in the prior art based on the principles of the present disclosure and implemented by replacing, adding, removing steps are comprised in the scope of the present disclosure.

The principle of the driving output method described in the present disclosure corresponds to the driving circuit. The driving circuit described in the present disclosure can implement the driving output method described in the present disclosure. The implementation device includes, but is not limited to, the structure of the driving circuit listed in the present disclosure. Any structural modification and replacement of the prior art based on the principle of the present disclosure are included in the protection scope of the present disclosure.

In summary, the driving output circuit, chip, and driving output method described in the present disclosure utilize NMOS transistors as high-level driving MOSFETs, which solves the reverse leakage problem in conventional output circuits adopting CMOS that occurs when an I/O external input level exceeds the operating voltage of the corresponding I/O circuit. Bootstrap drive technology is utilized to drive a driving MOSFET to form a strong drive during a level conversion phase to complete high-speed signal transmission, and a relatively weaker charge pump is utilized to drive a complementary driving MOSFET to maintain a strong drive at a steady state, and decouples transient impedance and steady state impedance by dynamically switching between the two modes utilizing the bootstrap drive and the charge pump to achieve high-speed signal transmission for single- or multi-channel I/O. Therefore, the present disclosure effectively overcomes various shortcomings of the prior art and has a high industrial value.

The above-mentioned embodiments only exemplarily illustrate the principles and effects of the present disclosure, but are not used to limit the present disclosure. Any person skilled in the art may modify or change the above embodiments without violating the spirit and scope of the present disclosure. Therefore, all equivalent modifications or changes made by those skilled in the art without departing from the spirit and technical concepts disclosed by the present disclosure should still be covered by the attached claims of the present disclosure.

As mentioned above, the driving output circuit, chip, and driving output method described in the present disclosure have the following beneficial effects:

NMOS transistors are adopted as high level driving MOSFETs, thereby solving a reverse leakage problem in conventional output circuits adopting complementary metal oxide semiconductor (CMOS), which occurs when an I/O external input level exceeds the operating voltage of the corresponding I/O circuit (when the I/O external input level exceeds the chip power supply voltage and the chip power supply is not powered); Bootstrap drive technology is utilized to drive a driving MOSFET to generate a strong drive during a level conversion phase to complete high-speed signal transmission, and a charge pump is utilized to drive a complementary driving MOSFET to maintain a strong drive at a steady state, and decouples transient impedance and steady state impedance by dynamically switching between the two modes utilizing the bootstrap drive and the charge pump to achieve high-speed signal transmission for single- or multi-channel I/O.

What is claimed is:

1. A driving output circuit, wherein the driving output circuit is used to drive an input signal and generate an output signal, wherein the driving output circuit comprises:
   a timer for outputting a timing signal based on a duration of a high level of the input signal;
   a bootstrap module for generating a first turn-on voltage based on the input signal;
   a charge pump, connected to the timer, for generating a second turn-on voltage based on the timing signal;
   a driving module, connected to the bootstrap module and the charge pump, respectively;
   wherein, the driving module comprises an upper driving metal-oxide-semiconductor field-effect transistor (MOSFET) and a lower driving MOSFET connected to the upper driving MOSFET, and wherein the upper driving MOSFET and the lower driving MOSFET are connected at a signal output; the first turn-on voltage and the second turn-on voltage are used to make the upper driving MOSFET and the lower driving MOSFET be turned on respectively so as to cause the signal output to output the output signal.

2. The driving output circuit according to claim 1, wherein the upper driving MOSFET comprises a first upper driving MOSFET and a second upper driving MOSFET, and wherein the first upper driving MOSFET and the second upper driving MOSFET are connected at the signal output;
   the first upper driving MOSFET is connected to the bootstrap module, receives the first turn-on voltage provided by the bootstrap module, and is turned on after receiving the first turn-on voltage, so as to cause the output signal to be high level;
   the second upper driving MOSFET is connected to the charge pump, receives the second turn-on voltage provided by the charge pump, and is turned on after receiving the second turn-on voltage, so as to cause the output signal to be high level.

3. The driving output circuit according to claim 2, wherein the driving module further comprises a first pre-driving unit, and the first pre-driving unit is connected to the first upper driving MOSFET for driving the first turn-on voltage and transmitting the first turn-on voltage to the first upper driving MOSFET.

4. The driving output circuit according to claim 3, wherein the first pre-driving unit comprises a first PMOS transistor and a first NMOS transistor;
   the first PMOS transistor has a gate connected to a gate of the first NMOS transistor, and the first PMOS transistor has a drain connected to a drain of the first NMOS transistor;
   when turned on, the first PMOS transistor transmits the first turn-on voltage to the first upper driving MOSFET;
   when turned on, the first NMOS transistor makes the first upper driving MOSFET be turned off.

5. The driving output circuit according to claim 2, wherein the driving module further comprises a second pre-driving unit, and the second pre-driving unit is connected to the second upper driving MOSFET for driving the second turn-on voltage and transmitting the second turn-on voltage to the second upper driving MOSFET.

6. The driving output circuit according to claim 5, wherein the timing signal comprises a first signal and a second signal;
   the second pre-driving unit comprises a second PMOS transistor and a second NMOS transistor;
   the second PMOS transistor has a gate connected to a gate of the second NMOS transistor, and the second PMOS transistor has a drain connected to a drain of the second NMOS transistor;
   the second PMOS transistor is configured to be turned on based on the second signal, and, when turned on, transmit the second turn-on voltage to the second upper driving MOSFET;
   the second NMOS transistor is configured to be turned on based on the first signal, and, when turned on, make the second upper driving MOSFET to be turned off.

7. The driving output circuit according to claim 1, wherein the bootstrap module comprises a control MOSFET and a bootstrap capacitor;
   the control MOSFET is connected to the bootstrap capacitor, and the control MOSFET and the bootstrap capacitor are connected at a connection point which serves as a bootstrap voltage output terminal;
   when turned on, the control MOSFET charges the bootstrap capacitor, and when the control MOSFET is turned off, a voltage at the bootstrap voltage output is lifted through the bootstrap capacitor.

8. The driving output circuit according to claim 7, wherein the bootstrap module further comprises a buffer, and the buffer is connected to the bootstrap capacitor for driving the bootstrap module for voltage boosting.

9. The driving output circuit according to claim 7, wherein the bootstrap module further comprises an AND gate, wherein a first input of the AND gate is for receiving the input signal, and a second input of the AND gate is for receiving a judgment signal obtained from converting the timing signal, to cause an output of the AND gate to output a gate voltage of the control MOSFET based on the input signal and the judgment signal.

10. The driving output circuit according to claim 9, further comprising:
a NAND gate, wherein a first input of the NAND gate is for receiving the timing signal and a second input of the NAND gate is for receiving the input signal, an output of the NAND gate is for outputting the judgment signal based on the timing signal and the input signal, and transmitting the judgment signal to the second input of the AND gate.

11. The driving output circuit according to claim 1, further comprising:
a third pre-driving unit, connected to the driving module, the bootstrap module and the timer, respectively, wherein the third pre-driving unit enhances driving capability of the input signal.

12. The driving output circuit according to claim 1, wherein the driving output circuit further comprises:
a level shifting circuit, connected to the timer and the charge pump, wherein the level shifting circuit is for performing level conversion on the timing signal to output a signal with a level matching the charge pump.

13. The driving output circuit according to claim 1, wherein
the timer is used to toggle operating states of the bootstrap module and the charge pump according to changes in magnitudes of the first turn-on voltage.

14. The driving output circuit according to claim 1, wherein
the lower driving MOSFET comprises a first lower driving MOSFET and a second lower driving MOSFET, and the first lower driving MOSFET and the second lower driving MOSFET are connected at the signal output;
the first lower driving MOSFET is connected to the bootstrap module, receives the first turn-on voltage provided by the bootstrap module, and is turned on after receiving the first turn-on voltage, so as to cause the output signal to be low level;
the second lower driving MOSFET is connected to the charge pump, receives the second turn-on voltage provided by the charge pump, and is turned on after receiving the second turn-on voltage, so as to cause the output signal to be low level.

15. A chip, comprising a driving output circuit, wherein the driving output circuit comprises:
a timer for outputting a timing signal based on a duration of a high level of an input signal;
a bootstrap module for generating a first turn-on voltage based on the input signal;
a charge pump, connected to the timer, for generating a second turn-on voltage based on the timing signal;
a driving module, connected to the bootstrap module and the charge pump, respectively;
wherein, the driving module comprises an upper driving MOSFET and a lower driving MOSFET connected to the upper driving MOSFET, and wherein the upper driving MOSFET and the lower driving MOSFET are connected at a signal output; the first turn-on voltage and the second turn-on voltage are used to make the upper driving MOSFET and the lower driving MOSFET be turned on respectively so as to cause the signal output to output an output signal.

16. The chip according to claim 15, wherein: the chip is a communication interface chip, and the communication interface chip is used for driving output for at least two input signals.

17. A driving output method, applied to a driving output circuit, wherein the driving output circuit comprises a timer, a bootstrap module, a charge pump and a driving module and being used to drive an input signal and generate an output signal, wherein the driving output method comprises:
outputting, by the timer, a timing signal based on a duration of a high level of the input signal;
providing, by the bootstrap module, a first turn-on voltage to the driving module based on the input signal, and the first turn-on voltage is generated by the bootstrap module; and
providing, by the charge pump, a second turn-on voltage to the driving module based on the timing signal, and the second turn-on voltage is generated by the charge pump.

* * * * *